United States Patent
Wu

(10) Patent No.: US 6,900,664 B2
(45) Date of Patent: May 31, 2005

(54) METHOD AND SYSTEM FOR INTELLIGENT BI-DIRECTION SIGNAL NET WITH DYNAMICALLY CONFIGURABLE INPUT/OUTPUT CELL

(75) Inventor: Leon Wu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 10/319,141

(22) Filed: Dec. 12, 2002

(65) Prior Publication Data

US 2004/0114412 A1 Jun. 17, 2004

(51) Int. Cl.[7] .............................................. H03K 19/175
(52) U.S. Cl. ............................. 326/86; 326/30; 326/90; 327/27; 327/57
(58) Field of Search ............................. 326/30, 81, 83, 326/86, 90, 38–41, 56–58; 327/108–112

(56) References Cited

U.S. PATENT DOCUMENTS

| | | |
|---|---|---|
| 5,654,653 A | 8/1997 | Coyle et al. |
| 5,687,330 A | 11/1997 | Gist et al. |
| 5,886,917 A | 3/1999 | Yasukawa et al. |
| 6,047,382 A | 4/2000 | Maley et al. |
| 6,054,881 A * | 4/2000 | Stoenner ..................... 327/112 |
| 6,127,849 A * | 10/2000 | Walker ......................... 326/86 |
| 6,239,612 B1 | 5/2001 | Shiflet |
| 6,285,211 B1 * | 9/2001 | Sample et al. ................ 326/41 |
| 6,304,106 B1 * | 10/2001 | Cecchi et al. ................ 326/86 |
| 6,690,191 B2 * | 2/2004 | Wu et al. ..................... 326/30 |
| 6,690,196 B1 * | 2/2004 | Cecchi et al. ................ 326/82 |

* cited by examiner

*Primary Examiner*—Vibol Tan
(74) *Attorney, Agent, or Firm*—Sawyer Law Group LLP

(57) ABSTRACT

A preferred embodiment includes a distributed network of a plurality of dynamically configurable bi-directional input/output (I/O) cells, each including a forward datapath having a first receiver, for receiving a first input signal from downstream driver on a first port of a signal line, coupled to a first driver for sending a first output signal to a first upstream receiver on a second port of the signal line; and a reverse datapath having a second receiver, for receiving a second input signal from a second downstream driver on the second port of the signal line, coupled to a second driver for sending a second output signal to a second upstream receiver on the first port of the signal line; wherein the first input signal and the second output signal are transmitted concurrently on the first port of the signal line.

7 Claims, 13 Drawing Sheets

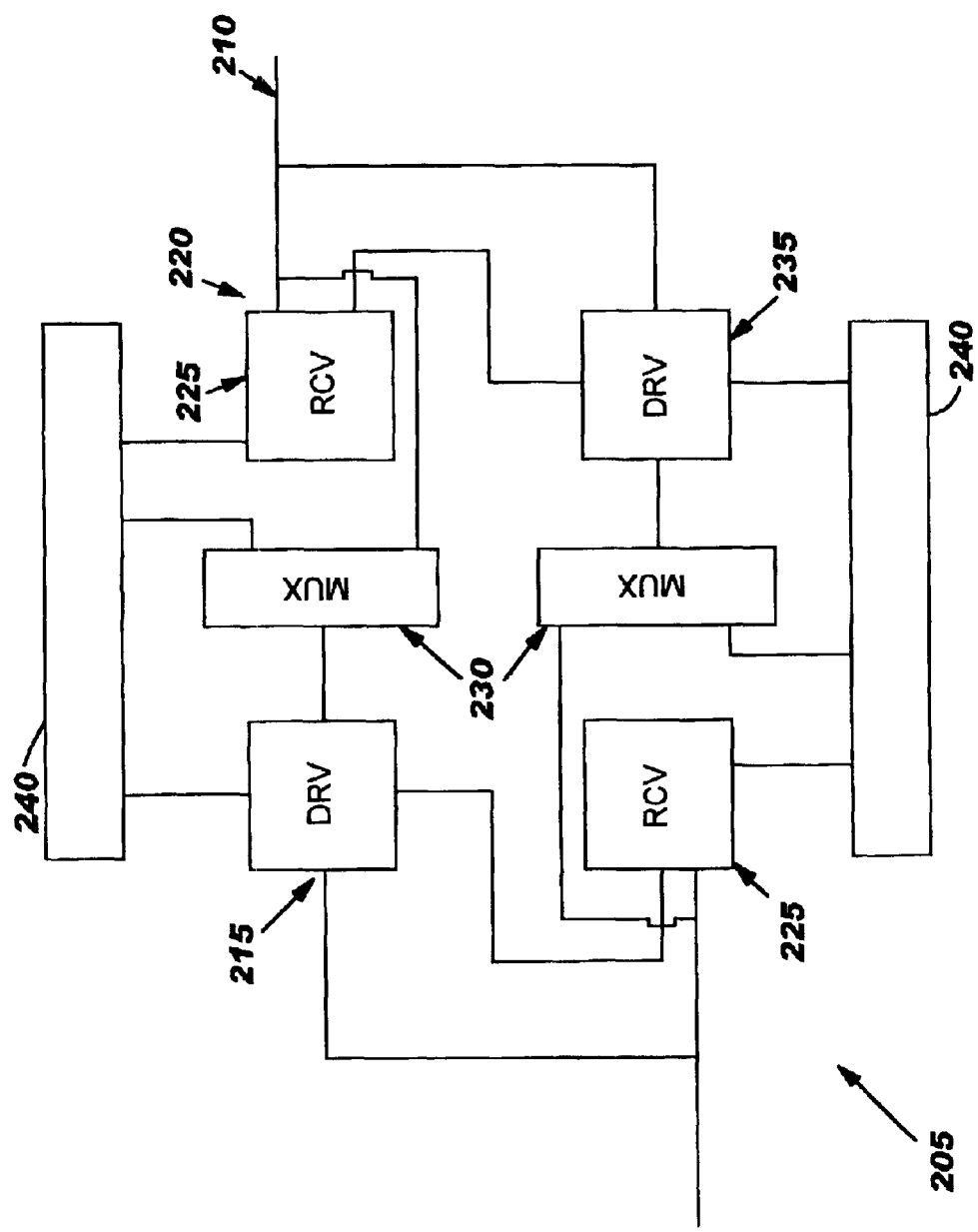

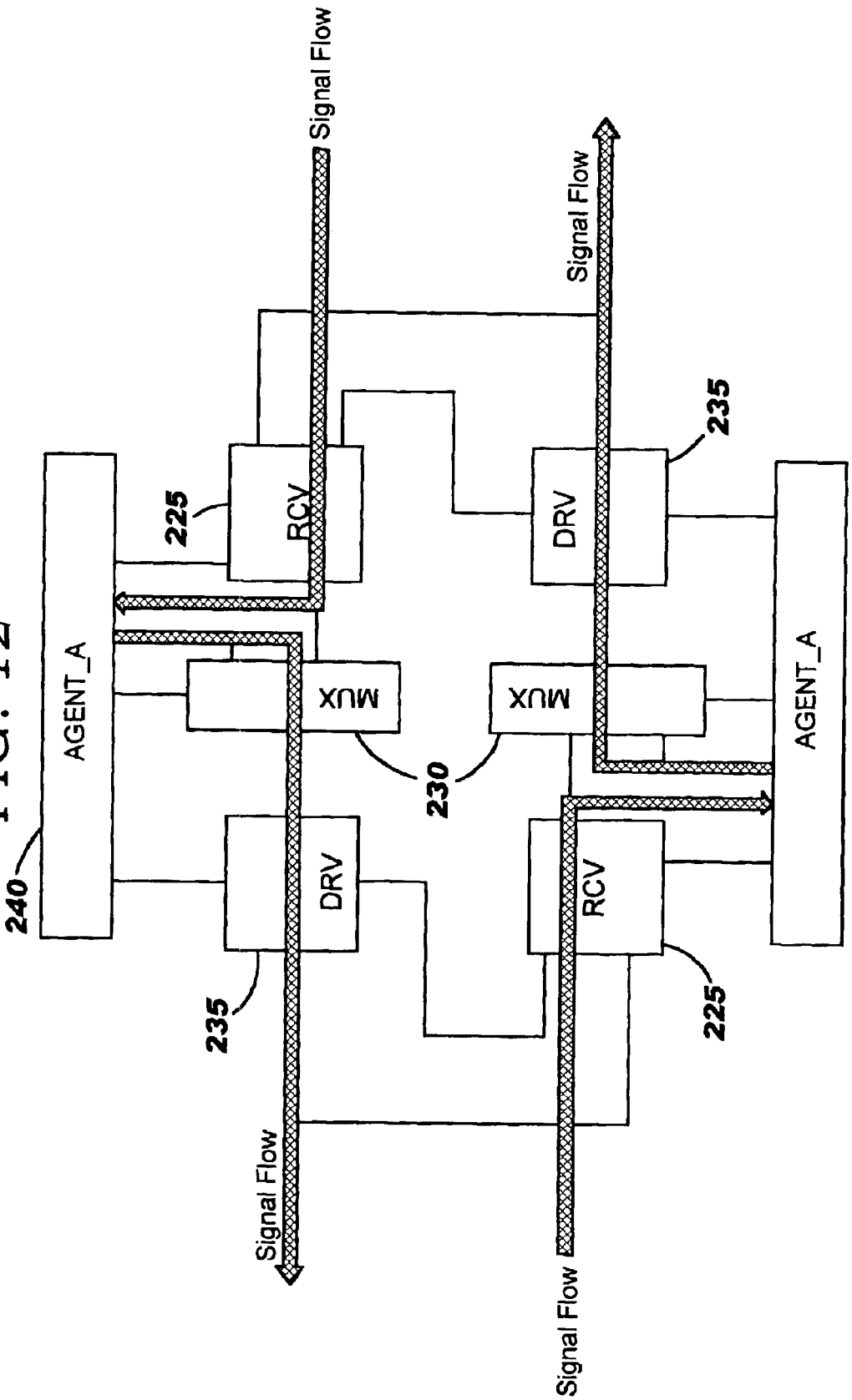

METHOD AND SYSTEM FOR INTELLIGENT BI-DIRECTION SIGNAL NET WITH DYNAMICALLY CONFIGURABLE INPUT/OUTPUT CELL

FIELD OF THE INVENTION

The present invention relates generally to input/output (I/O) cells used in computing system busses, and more particularly to a more efficient dynamically reconfigurable I/O cell.

BACKGROUND OF THE INVENTION

There are many types of busses used in computing systems. For example: a system bus between several processors and a memory controller; a system cluster bus among several link chips of various systems; a memory bus between several dynamic random access memory (DRAM) reporting chips and a memory controller; a DRAM bus linking several dual-inline memory modules (DIMMs) to its reporting chip; a common program peripheral component interface (PCI) bus linking PCI bridge chips, PCI bus slave and PCI master together.

These buses generally use two major signal routing schemes: (1) OTA—one agent to all other agents; or (2) OTO—one agent to only one agent on the bus. For the routing schemes, there is a requirement that there be one signal per signal I/O pin.

A figure of merit for signal routing schemes is I/O pin data efficiency. A high I/O pin data efficiency means more data transfer per I/O pin. I/O pin data efficiency is a product of signal I/O pin efficiency and data frequency efficiency.

A common use of these signal routing schemes for busses described above is a distributed network or distributed net. FIG. 1 is a block schematic diagram of a prior art distributed net 100. Net 100 includes a main signal line 105, a signal I/O pin 105A and a plurality of stubs 110. All agents 115 are attached to main signal line 105 by a stub 110 with one signal I/O pin 115A. Net 100 thus includes one I/O pin 1115A per distributed net. Any single agent 115 sends data and commands to any other agent over signal line 105 thru I/O pin 115A. There are several different configurations for net 100 that have been used: a double end termination distributed net 100 (used as a system bus); a serial termination (SSTL) distributed net 100 (used as a DDR memory bus); and an open end distributed net 100 (used for PCI bus) are examples of the versatility of the prior art system. However, in terms of operation frequency, distributed net 100 is far from ideal. The characteristics of net 100 that limit the frequency that the signals may be carried over net 100 include the plurality of positive and negative reflection points along the signal paths and the phase shifts that are introduced by the stub lines. Each middle agent has an open end that is a positive reflection point and each stub-to-main-line intersection is a negative reflection point. The length of each stub line introduces a phase shift for signals propagating down main line 105, with longer stub lines 110 causing a larger phase shift. The result is that signals of distributed net 100 usually exhibits significant undershoot/overshoot, rise time degradation ad irregular phase shift. These effects effectively limit the operational frequency of distributed net 100, which degrades the IO data efficiency of distributed net 100.

Accordingly, what is needed is a system and method for improved IO data efficiency as compared to the distributed network scheme of the prior art. The present invention addresses such a need thru maintaining I/O pin efficiency but increasing the data frequency efficiency.

SUMMARY OF THE INVENTION

A system and method are disclosed for improving IO data efficiency as compared to the distributed network scheme of the prior art is disclosed. A preferred embodiment includes a distributed network of a plurality of dynamically configurable bidirectional input/output (I/O) cells, each cell including a forward datapath having a first receiver, for receiving a first input signal from a first downstream driver on a first port of a signal line, coupled to a first driver for sending a first output signal to a first upstream receiver on a second port of the signal line; and a reverse datapath having a second receiver, for receiving a second input signal from a second upstream driver on the second port of the signal line, coupled to a second driver for sending a second output signal to a second downstream receiver on the first port of the signal line; wherein the first input signal and the second output signal are transmitted concurrently on the first port of the signal line. A method for configuring an input/output (I/O) cell includes the steps of asserting a first selection signal to a first multiplexer in the cell, the first multiplexer having a first input coupled to an output of a first receiver, a second input coupled to a first cell input, and an output coupled to both a first input of a second receiver and an input of a first driver, for selectively routing one of the inputs of the first multiplexer to the output of the first multiplexer in response to the first selection signal, wherein the output of the first receiver is coupled to a first cell output and a second input of the first receiver is coupled to a first port of a signal line; and asserting a second selection signal to a second multiplexer in the cell, the second multiplexer having a first input coupled to an output of a second receiver, a second input coupled to a second cell input, and an output coupled to both a first input of a first receiver and an input of a second driver, for selectively routing one of the inputs of the second multiplexer to the output of the second multiplexer in response to the second selection signal, wherein the output of the second receiver is coupled to a second cell output and a second input of the second receiver is coupled to a second port of the signal line; wherein an output of the first driver is coupled to the second input of the second receiver and an output of the second driver is coupled to the second input of the first receiver.

The routing scheme of the I/O cells for the present invention utilizes a "ring" structure, each cell has two ports connected to the signal line: one port connecting to an upstream cell and the other port connecting to a downstream cell. The signal line of port 1 is connected to the signal line of port 2 of downstream cell. The signal line of port 2 is connected to the port 1 of the upstream cell. The signal line of port 1 of the most downstream cell is wrapped around the connecting to the signal line of port 2 of the most up stream cell, thus completing a ring for the signal line. Each cell can be dynamically, and independently, configured into any of several different modes, including a simultaneous bi-directional signal propagation mode, or a uni-directional clockwise and counterclockwise propagation. Different applications and scenarios will have different configurations at different times, dependent upon many factors. Further details regarding the configuration modes and example uses of the modes are described below.

BRIEF DESCRIPTION OF THE DRAWINGS

FIG. 2A is a block schematic diagram of an alternated implementation of cell 205 with lower insertion delay;

FIG. 4 illustrates a voltage signal Vs on signal line and the reference voltage generated by a voltage source;

FIG. 5 illustrates a voltage V1 present at a node of the first cell;

FIG. 6 illustrates a voltage V2 present at the node of the second cell; and

FIG. 7 illustrates the voltage output (V_out) of a receiver of the first cell;

FIGS. 8–12 are specific preferred configuration modes for any particular cell, with any cell in a net able to be dynamically configured into any one of seven different modes at any time;

FIG. 8 illustrates both Mode 1A and Mode 1B;

FIG. 10 illustrates Mode 3 which is bi-direction relay and snooping;

FIG. 12 illustrates Mode 5, bi-direction driving and snooping;

FIG. 13 is the one agent to all other agent configuration routing scheme;

FIG. 14 is the any agent to an agent configuration routing scheme for net; and

FIG. 15 is the two agents to each other and all other agents configuration routing scheme.

DETAILED DESCRIPTION

The present invention relates to improving IO data efficiency as compared to the distributed network schemes of the prior art. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
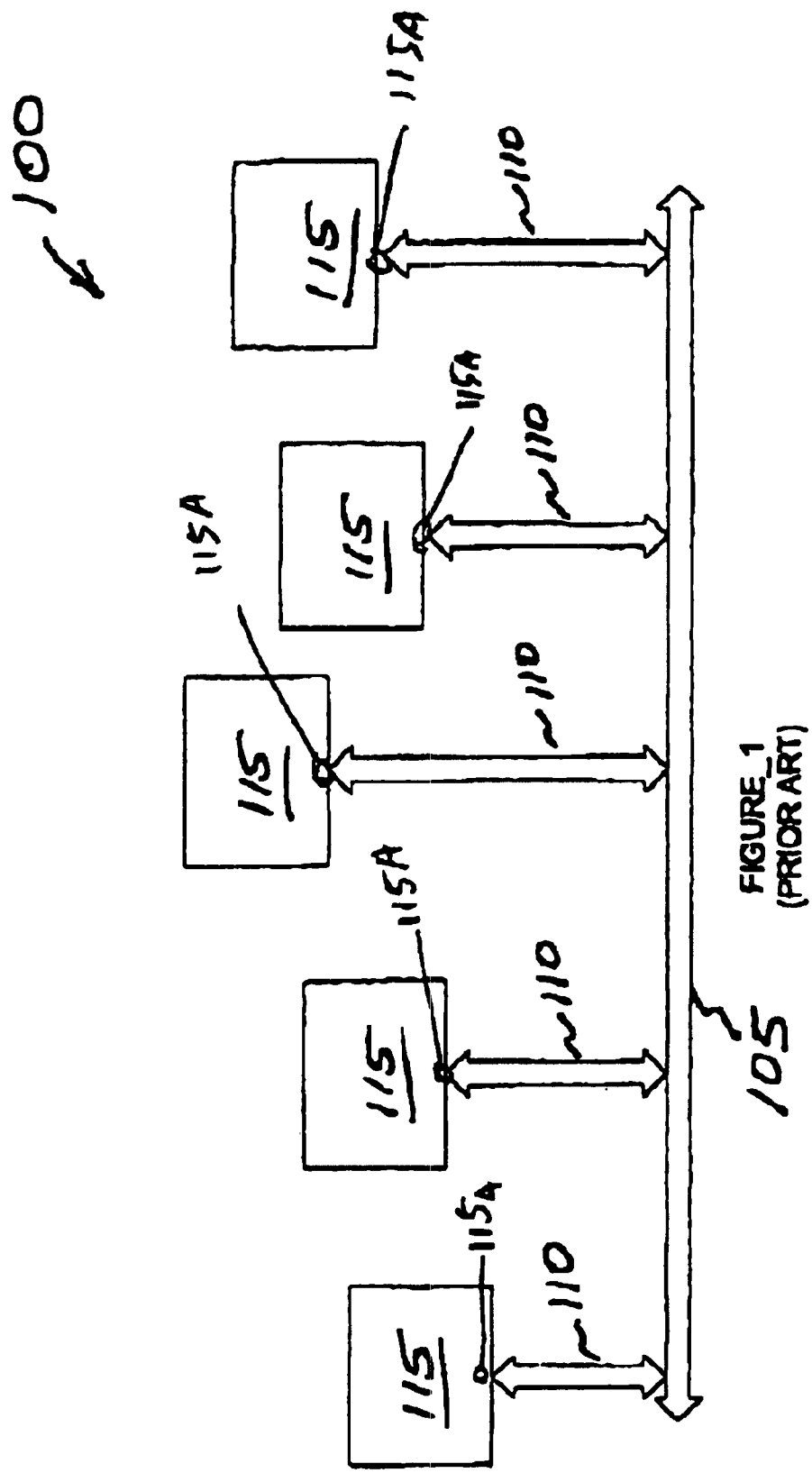
FIG. 1 is a block schematic diagram of a prior art distributed net configuration.
Figure 2:
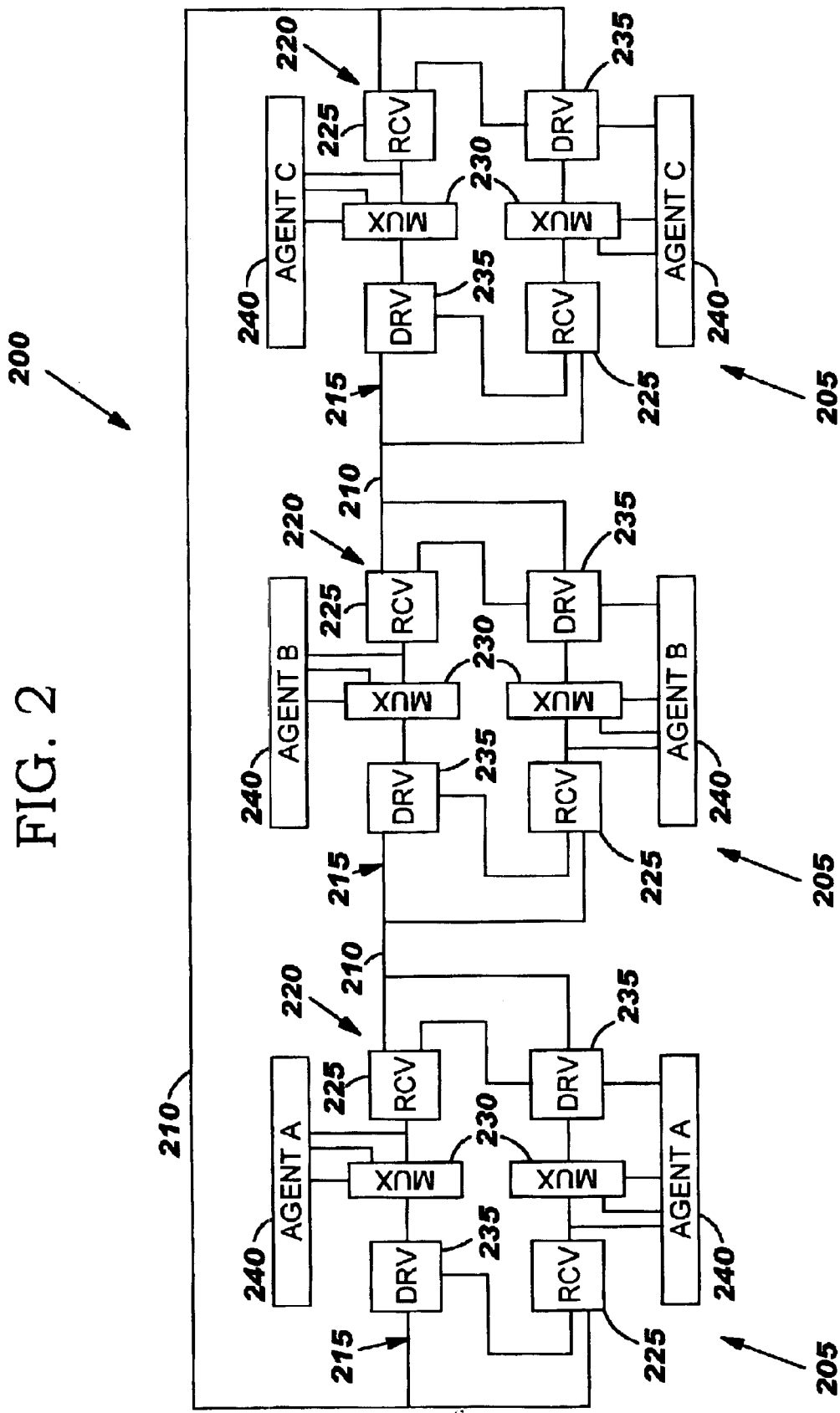
FIG. 2 is a block schematic diagram of a preferred embodiment of the present invention.

FIG. 2 is a block schematic diagram of a preferred embodiment of the present invention for a distributed net 200. Net 200 includes a plurality of dynamically configurable input/output (I/O) cells 205. To simplify the discussion, net 200 is illustrated with three cells 205, though other applications may use a greater, or a lesser, number of cells 205. Each cell 205 is connected to a single signal line 210, with each cell 205 having two signal ports: a first port 215 connected to signal line 210 to a downsteam cell 205 and a second port 220 connected to signal line 210 to an upstream cell 205.

Each cell 205 includes a forward datapath and a reverse datapath. The forward datapath is a path from the downstream (or second) port 220 to the upstream (or first) port 215. The reverse datapath is a path from the upstream (of first) port 215 to the downstream (or second) port 220. Each datapath includes a differential receiver (RCV) 225, a multiplexer (MUX) 230, and a driver (DRV) 235. An agent 240 of each cell is coupled to both datapaths to control routing, switching and component enablement. Again for clarity, agent 240 is shown as two blocks, though typically each cell will include a single agent 240. Also, for simplicity, agent 240 is illustrated as both a source and target of both control signals and data signals. In some applications, agent 240 may be a controller only with data flowing into and/or out of other chip circuitry coupled to I/O cell 205. Other configurations are also possible.

Each datapath is configured with receiver 225 implemented as a dual-input differential receiver, one input coupled to a port and the other input coupled to a reference signal generated by the driver of the other datapath. An output of receiver 225 is coupled to both a first input of multiplexer 230 and to agent 240. A second input of multiplexer 230 is coupled to agent 240. Agent 240 is thus able to independently and configurably sample/extract/receiver/snoop as well as to insert signals/commands/data into each datapath. A selector signal for multiplexer 230 is provided by agent 240 to route the output of receiver 225 or a signal from agent 240 to an output of multiplexer 230.

The output of multiplexer 230 is routed to an input of driver 235 of the same datapath as receiver 225. Driver 235 has an enable signal controlled by agent 240 to selectively enable/disable the output drive. A disabled driver 235 does not drive any signal onto signal line 210. Additionally, driver 235 includes a voltage generator to generate a reference voltage used by the receiver of the other datapath (shown in FIG. 3 below). When enabled, driver 235 attempts to drive signal line 210 at the appropriate level.

For unidirectional signal propagation, only one datapath will be active at any time. Receiver 225 takes a value of a signal from one I/O cell 205 on signal line 210, routes it to multiplexer 230, which routes the receiver output signal to driver 235 to be driven onto signal line 210 to the next I/O cell. Any agent in any cell 205 is able to receive the signal by sampling the output of receiver 225 at the appropriate time.

Each cell 205 may also be configured into a simultaneous bi-directional mode in which both datapaths of an I/O cell 205 are active. Note that each segment of signal line 210 between any two I/O cells has two drivers 235 driving their signals independently onto the signal line. As will be explained in more detail below, drivers 235 can be configured to generate three discrete signal levels: a high value when both are driving signal line 210 high, a low value when both are driving signal line 210 low, and an intermediate value when they are driving signal line 210 in opposite levels. The reference voltage level given to a receiver 225 from driver 235 in the same cell 205 but from the other datapath permits the receiver to determine, in the case of intermediate values, what signal was being transmitted from driver 235 of the other I/O cell 205. For example, when the signal on signal line 210 is at the intermediate value, and driver 235 of the same I/O cell has the low value, receiver 225 determines that driver 235 from the other cell 205 on signal line 210 is sending a high value. Thus, each receiver 225 properly receives the signal value transmitted from the other I/O cell even when two drivers are actively and simultaneously driving the single signal line.

Figure 3:
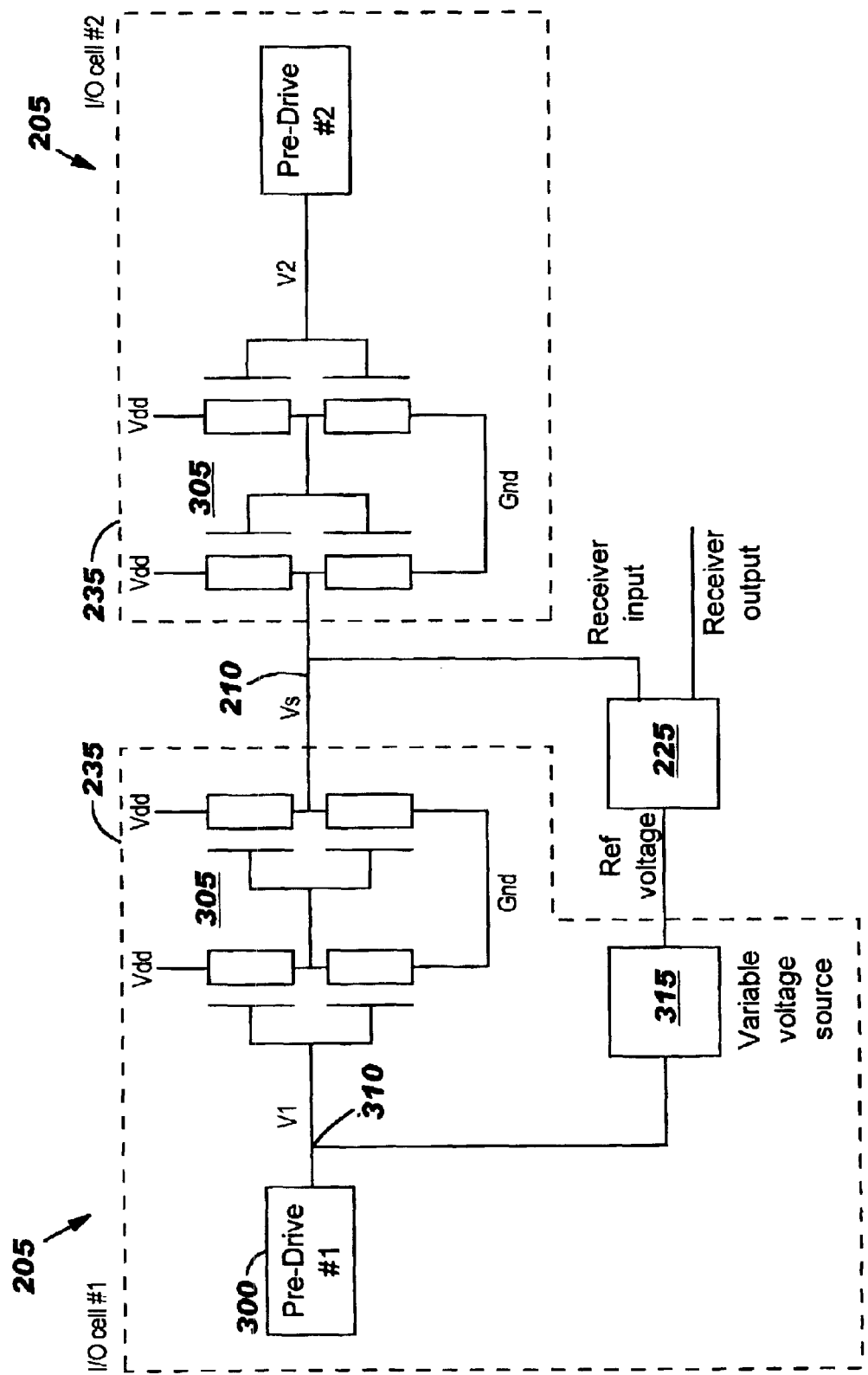
FIG. 3 is a schematic block diagram of circuit elements used in the receiver and driver to implement simultaneous bi-directional signaling between two I/O cells.

FIG. 3 is a schematic block diagram of circuit elements used in receiver 225 and driver 235 to implement simultaneous bi-directional signaling between two I/O cells. FIG. 3 includes differential receiver 225 of a first I/O cell 205 receiving a first input from signal line 210. Drivers 235 of two cells 205 are shown, each driver 235 having a predrive 300, an output stage 305 and a variable voltage source 315. Predrive 300 drives an output signal onto node 310, which is coupled to an input of output stage 305 and voltage source 315. Output stage 305 is an inverter with both p-channel and n-channel devices presenting an impedance of fifty ohms. Voltage source 315 outputs a reference voltage that is derived from the output of predrive 300. This reference voltage is designed to change in synchronism with the voltage at node 310, but is scaled to range from 0.75 VDD TO 0.25 VDD. For each segment of signal line 210 extending between pairs of I/O cells 205, output stages 305 of each driver 235 are coupled together.

When drivers 235 drive the segment of signal line 210 at the same level, signal line 210 is driven to the high or low value. When drivers 235 drive the segment to different levels (e.g., one high and one low), output stages 310 form a voltage divider. In the preferred embodiment, the values of the devices in output stage 310 are chosen to produce an intermediate value on the segment of about fifty percent of VDD when drivers 235 are driving the segment at different values.

Thus, when node 310 is low for both drivers 235, the segment of signal line 210 is also at a low value while voltage source 315 generates a voltage that is somewhat higher (i.e., 0.25 VDD). Therefore, both receivers will receive a low value. When node 310 is high for both drivers 235, the segment of signal line 210 is also high, while voltage source 315 generates the reference voltage somewhat lower (i.e., 0.75 VDD). Therefore, both receivers will receive a high value.

When node 310 is low for first cell 205 and high for second cell 205, the segment is driven at 0.5 VDD. The voltage reference for the first cell is at 0.25 VDD while the voltage reference for the second cell is at 0.75 VDD. Therefore each receiver of the two cells receives a different value: the first cell receives (output of receiver 225) a high value and the second cell receives a low value.

Figure 4:
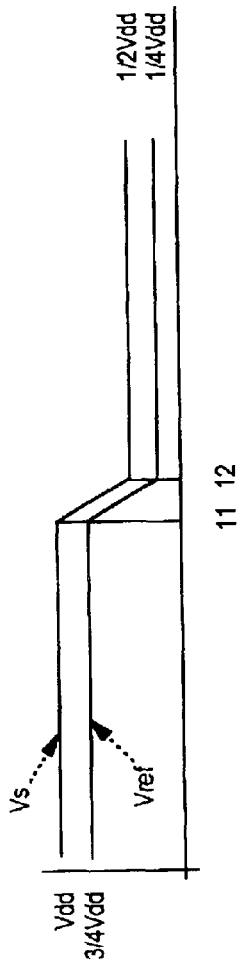
FIGS. 4–7 illustrate voltage timing waveforms present in the circuit shown in FIG. 3 for a first I/O cell.
Figure 5:
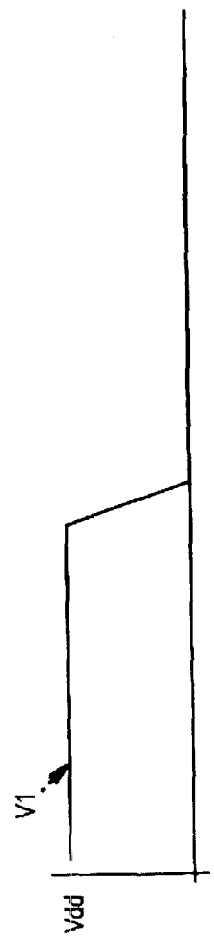
Figure 6:
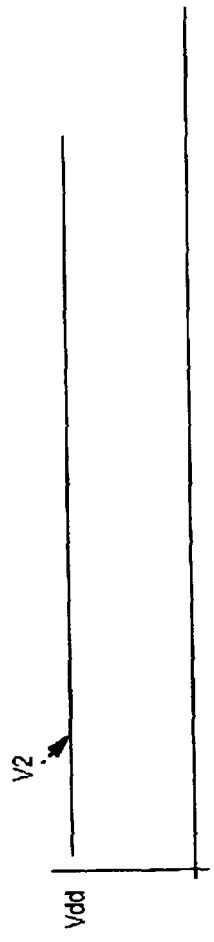
Figure 7:
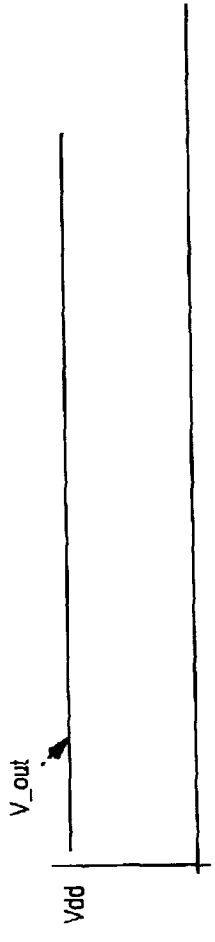

FIGS. 4–7 illustrate voltage timing waveforms present in the circuit shown in FIG. 3 for the first I/O cell. FIG. 4 illustrates a voltage signal Vs on signal line 210 and the reference voltage generated by voltage source 315, FIG. 5 illustrates a voltage V1 present at node 310 of the first cell 205, FIG. 6 illustrates a voltage V2 present at node 310 of the second cell 205, and FIG. 7 illustrates the voltage output (V_out) of receiver 225. As described above, when both V1 and V2 are at the high level (VDD), V_out is also high. When V1 transitions low (0) and V2 remains high, Vs transitions to 0.5 VDD, Vref transitions to 0.25 VDD, so that V_out remains high (the value of V2 from second cell 205).

FIGS. 8–12 are specific preferred configuration modes for any particular cell 205, with any cell in a net 200 able to be dynamically configured into any one of seven different modes at any time. Agent 240 for each cell 205 controls four configuration bits per cell 205: a selection signal for each multiplexer 230 and an enable signal for each driver 235.

Figure 8:
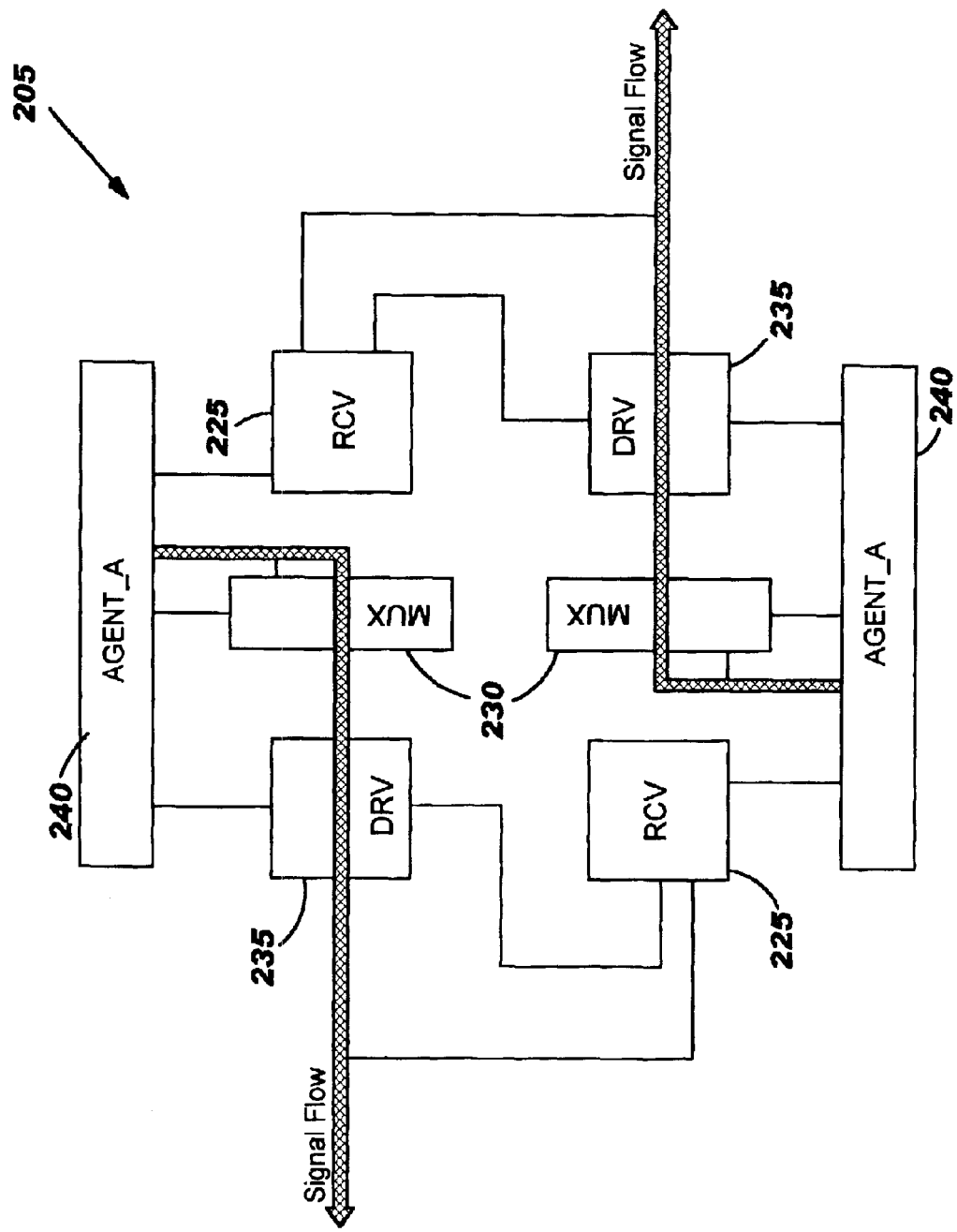

FIG. 8 illustrates both Mode 1A and Mode 1B. Mode 1A is uni-direction driving, which for purposes of this application means one signal flow on any signal line segment at one time. This is distinguished from bidirectional flow in which two signals flow in opposite directions on the same signal line segment at the same time. Mode 1A drives one signal from agent 240 to one port of signal line 210. Both drivers of cell 205 are in source terminated impedance mode, meaning that a driver at the other end of the signal line segment from cell 205 is disabled. Also shown in FIG. 8 is bi-direction driving in which two signals are launched from cell 205: one upstream from agent 240 and the other downstream from agent 240. Both drivers in this case are in double end terminated impedance mode, therefore drivers at the ends of the segments of signal line 210 are enabled.

Figure 9B:
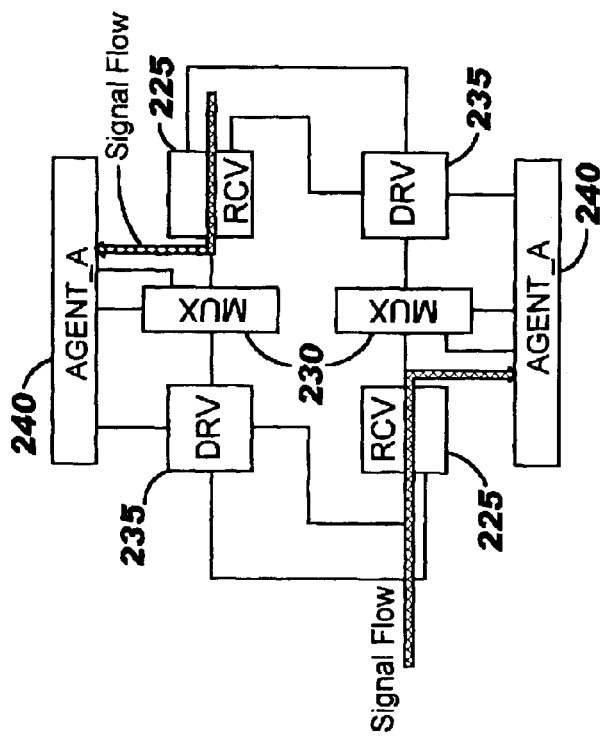
FIG. 9A and FIG. 9B illustrate Mode 2A and Mode 2B respectively.
Figure 9A:
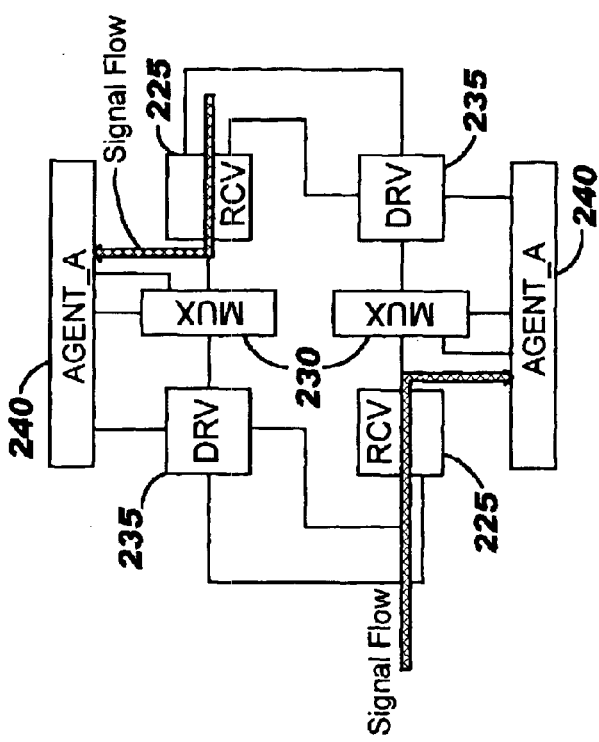

FIG. 9A and FIG. 9B illustrate Mode 2A and Mode 2B respectively. FIG. 9A (Mode 2A) is receiving from bi-direction driving. In this mode, a near end driver acts as termination for a far end driver, both drivers 235 are enabled and both receivers are also enabled to simultaneous bi-direction mode. Signals received from both segments (a downstream signal and an upstream signal) are both delivered to agent 240. As discussed above, the signal level for bi-directional signaling can have logic levels at VDD, 0.5 VDD and 0 volts; therefore the active swing for the receiver is half VDD.

FIG. 9B (Mode 2B) is receiving from a uni-direction driving. In this mode, a far end driver is in source impedance termination mode, therefore both drivers in cell 205 are disabled for Mode 2B. Active signal swing on the signal line segments connected to an I/O cell 205 in Mode 2B is VDD. Both receivers are enabled as uni-direction receiving, with the nominal receiver switching threshold at half the power supply level. Therefore signals received through this configured I/O cell 205 possess superior noise immunity, making it desirable for high frequency data transfer.

Figure 10:
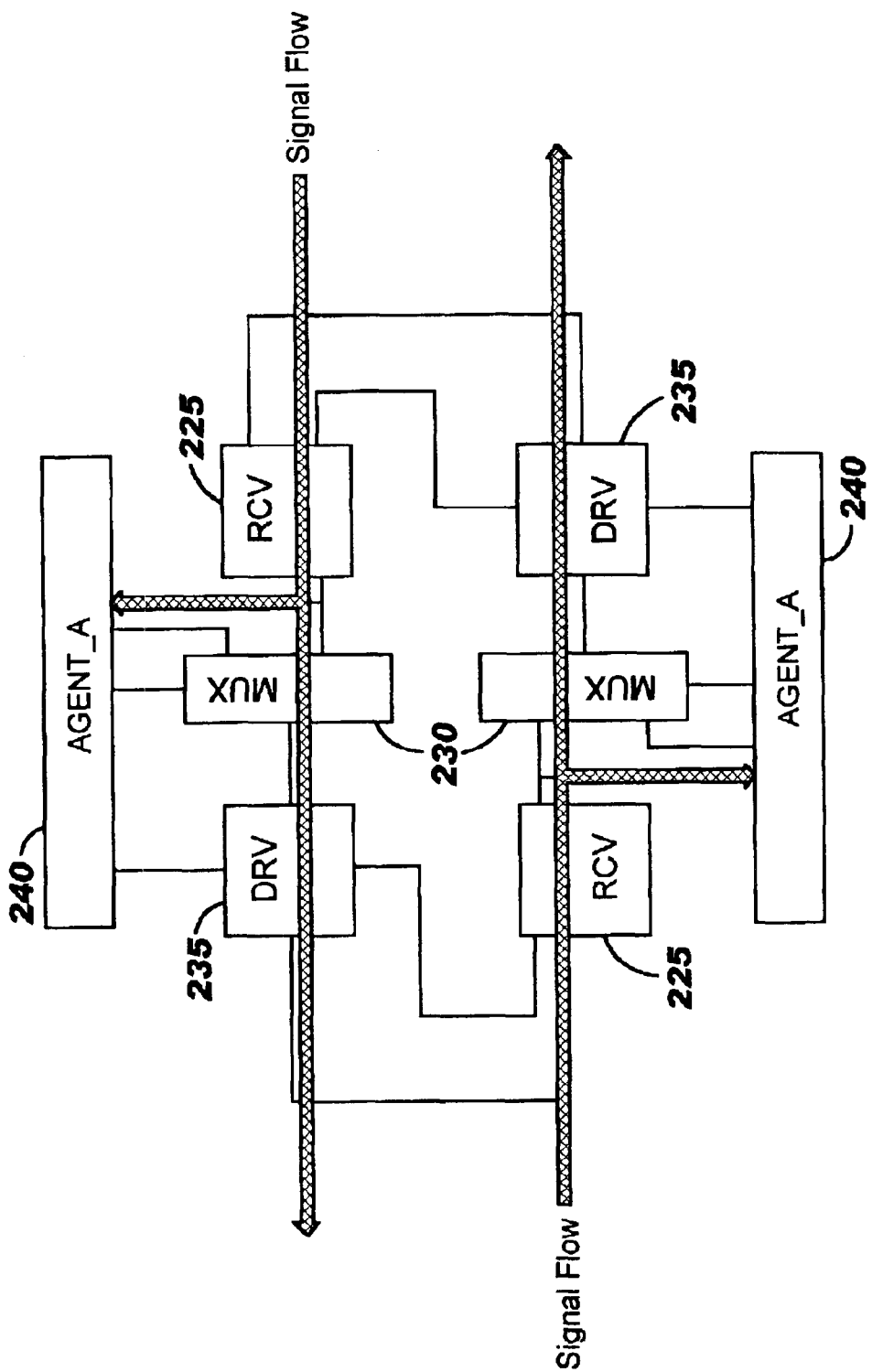

FIG. 10 illustrates Mode 3 which is bi-direction relay and snooping. Both drivers are enabled and both receivers are in bi-directional signaling mode. The multiplexers 235 route the output of the receivers to the driver, and then to signal line 210. Driver on the other end of this segment will be enabled. Agent 240 is also able to sample the data through the connection to the output of the receivers.

Figure 11B:
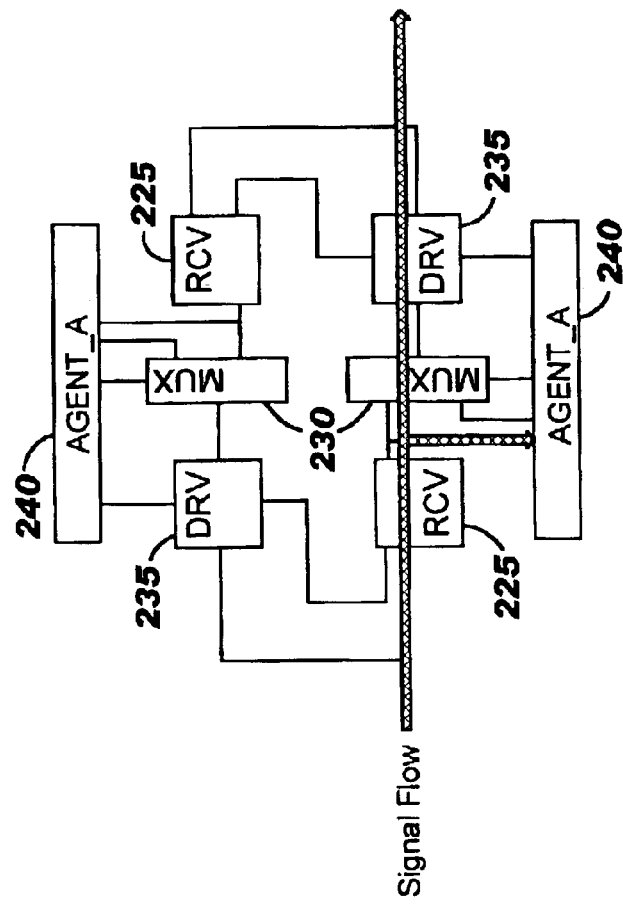
FIG. 11a and FIG. 11b illustrate Mode 4A and Mode 4B respectively.
Figure 11A:
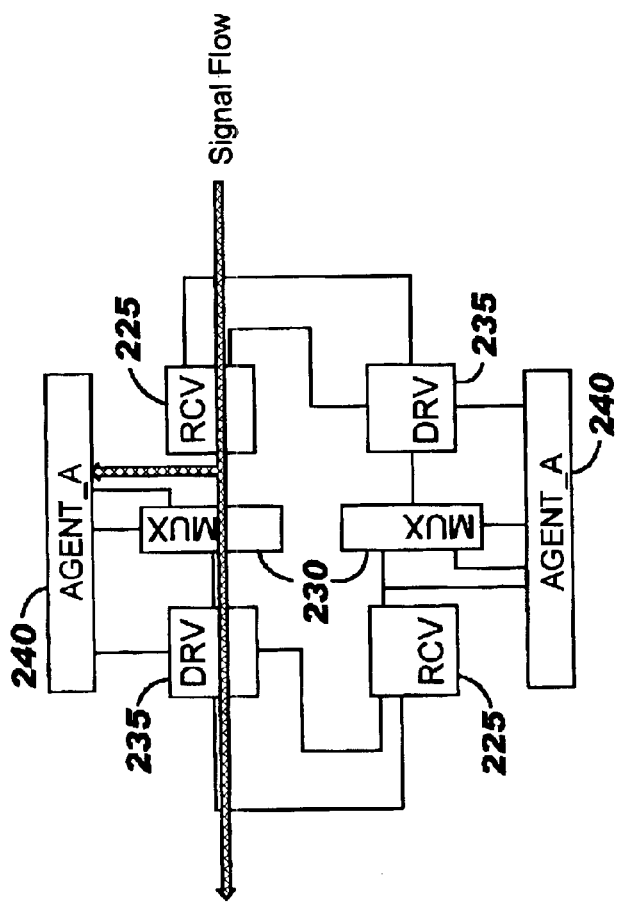

FIG. 11a and FIG. 11b illustrate Mode 4A and Mode 4B respectively. Mode 4A and Mode 4B are uni-directional relay and snooping, the difference being which port is relayed and snooped. In FIG. 11a, a forward datapath driver 235 is enabled and the other is disabled. Receiver 225 in the forward datapath is set to uni-direction mode and multiplexer 230 of the forward datapath relays signals from the output of the forward datapath receiver to the enabled driver. Agent 240 may sample the data as desired. Both drivers driving the segment are in source impedance termination mode, the driver at the end of the signal line segment is disabled.

FIG. 11b enables the downstream datapath driver and disables the upstream datapath driver, and receiver 225 in the downstream datapath is in uni-direction mode. Signals from the other direction are relayed and snooped, with terminations described as in FIG. 11a, except with respect to which driver is enabled.

FIG. 12 illustrates Mode 5, bi-direction driving and snooping. Both drivers are enabled and drive signals from agent 240 to the upstream and downstream segments of signal line 210. Additionally, agent 240 is able to receive data signals from the outputs of both receivers, as desired.

Figure 13:
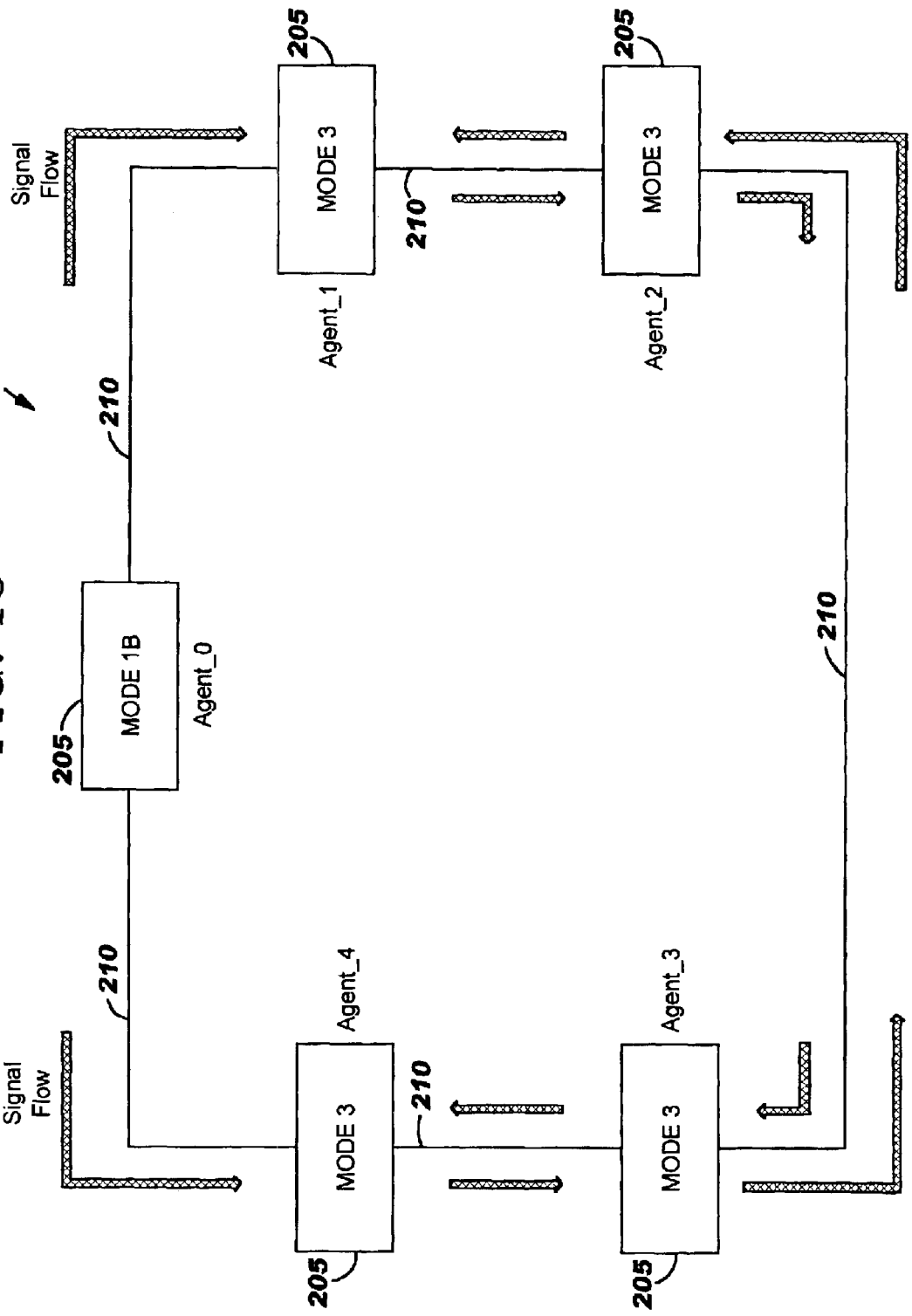
FIGS. 13–15 are example signal line routing configurations for five I/O cells in a net.
Figure 14:
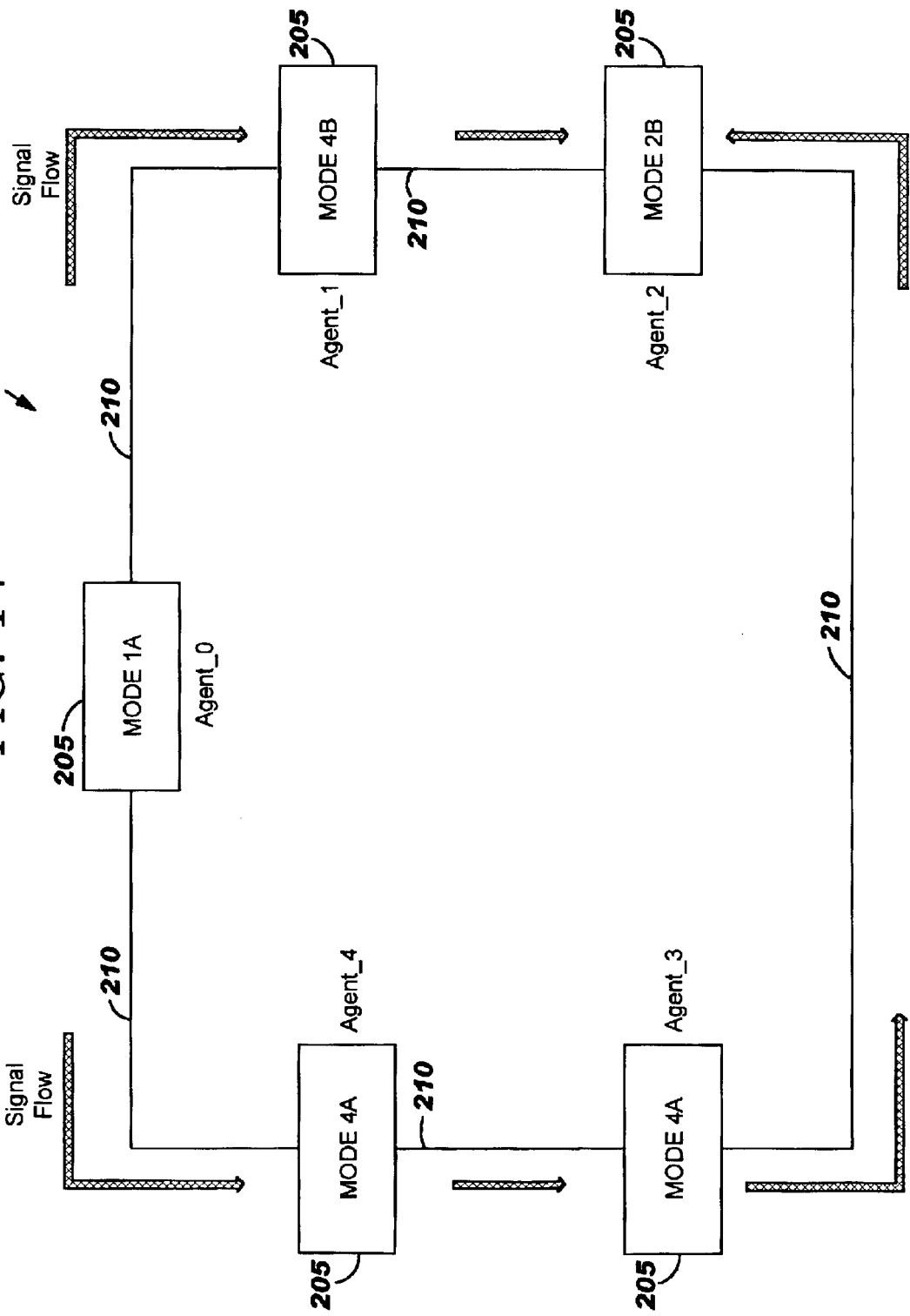
Figure 15:
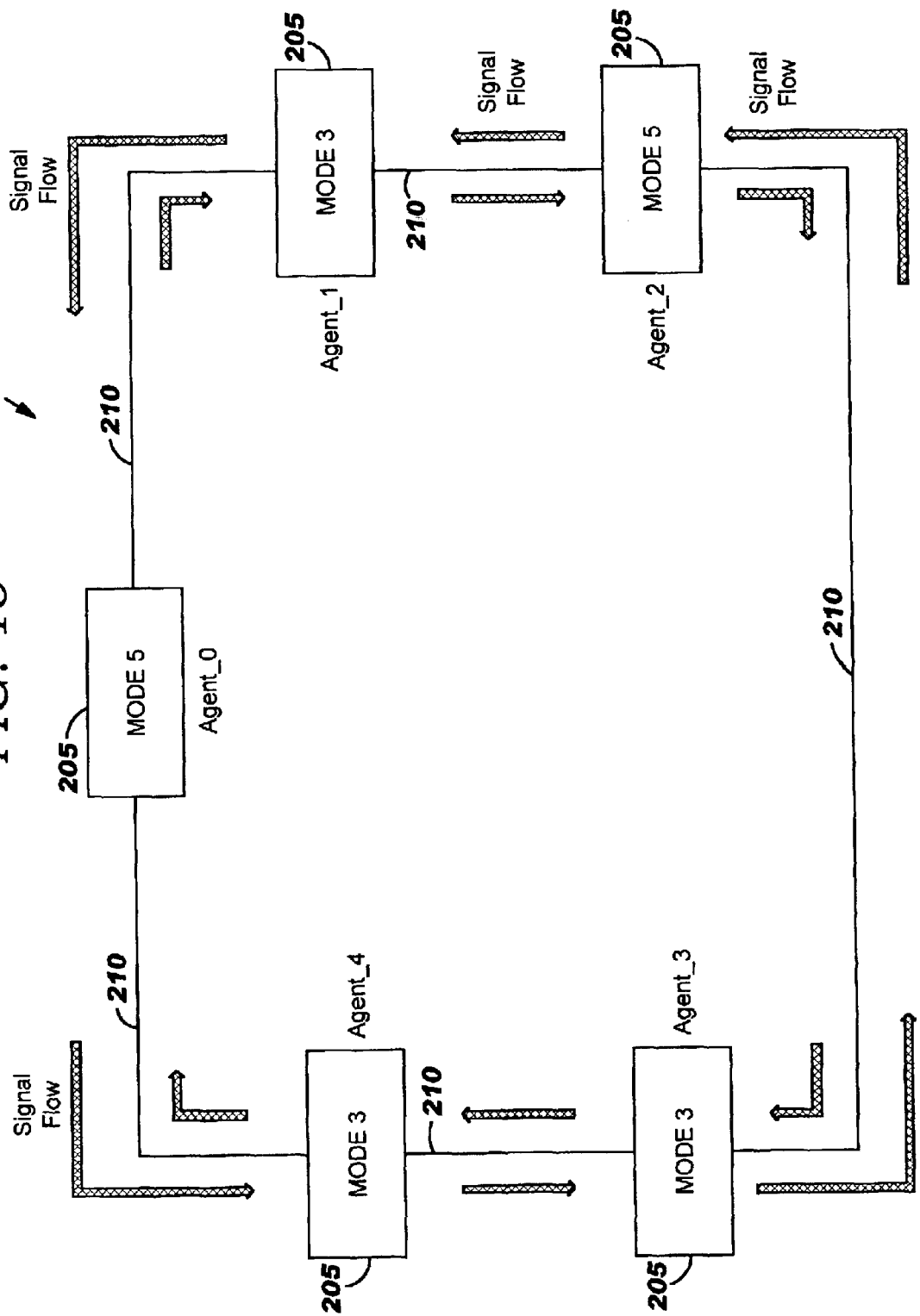

FIGS. 13–15 are example signal line routing configurations for five I/O cells 205 in net 200. Suitable configurations of cell modes by these agents permits net 200 to be used efficiently in many different routing schemes. There are other configurations than those shown here for net 200, and net 200 may include a greater or lesser number of I/O cells than shown here. However, the three routing schemes shown are preferred configurations as they have utility in current computing system environments. The three signal routing schemes are: 1) any agent to all other agents on the net, 2) any agent to an agent on the net, and 3) any two agents to each other and to all other agents on the net.

FIG. 13 is the one agent to all other agent configuration routing scheme. In this configuration, Agent_0 is the one agent and places its cell 205 in Mode 1B (bi-directional driving) as discussed above. All other agents configure their cells 205 in Mode 3 (bi-directional relay and snooping). FIG. 13 illustrates the signal flow.

FIG. 14 is the any agent to an agent configuration routing scheme for net 200. For this configuration, agent_0 is the driving agent and is Mode 1B (bi-directional driving). Agent_02 is the target agent and configures its cell 205 into Mode 2B (bi-direction receiving). Agent_03 and agent 04 are in Mode 4A (uni-direction relay and snooping) and agent_01 is in Mode 4B (uni-direction relay snooping). Signal flow is as shown in FIG. 14.

FIG. 15 is the two agents to each other and all other agents configuration routing scheme. Agent_0 and agent_2 are the driving and target agents, each being in Mode 5 (bi-direction driving and receiving). All other agents are in Mode 3 (bi-direction relay and snooping). Signal flow is as shown in FIG. 15.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An input/output (I/O) cell, comprising:
   a forward datapath, coupled to a signal line, for receiving an input signal, wherein the forward datapath includes a first receiver, for receiving the input signal from a downstream driver on a first port of the signal line, the first receiver coupled to a first driver for sending an upstream output signal to an upstream receiver on a second port of the signal line; and
   a reverse datapath, coupled to the signal line, for transmitting an output signal to the signal line concurrently with receiving the input signal, wherein the reverse datapath includes a second receiver, for receiving a second input signal from an upstream driver on the second port, the second receiver coupled to a second driver for sending the output signal to a downstream receiver on the first port.

2. A input/output (I/O) system, comprising:
   a first I/O cell, including:
   a receiver, coupled to a signal line, for receiving an input signal; and
   a driver, coupled to the signal line, for transmitting an output signal to the signal line concurrently with receiving the input signal;
   a second I/O cell, including:
   a receiver, coupled to the signal line, for receiving the input signal; and
   a driver, coupled to the signal line, for transmitting the output signal to the signal line.

3. An input/output (I/O) system, comprising:
   a first I/O cell, including:
   a forward datapath including:
   a first receiver, coupled to a first port of a signal line, for receiving a first input signal; and
   a first driver, coupled to a second port of the signal line, for transmitting a first output signal to the second port of the signal line;
   a reverse datapath, including:
   a second receiver, coupled to the second port of the signal line, for receiving a second input signal; and
   a second driver, coupled to the first port of the signal line, for transmitting a second output signal to the first port of the signal line;
   a second I/O cell, including:
   a third receiver, coupled to the first port of the signal line, for receiving the second output signal from the first port of the signal line; and
   a third driver, coupled to the first port of the signal line, for transmitting the first input signal to the first port of the signal line
   a third I/O cell, including:
   a fourth receiver, coupled to the second signal line, for receiving the first output signal; and
   a fourth driver, coupled to the second signal line, for transmitting the second input signal to the signal line.

4. A signaling system for a plurality of input/output (I/O) cells, comprising:
   a first driver of a first I/O cell for transmitting a first signal to a second I/O cell on a signal line; and
   a second driver of the second I/O cell for transmitting a second signal to the first I/O cell on the signal line;
   wherein each I/O cell includes a receiver, coupled to each of the drivers, for extracting the signal of the driver of the other I/O cell, and the signal line is driven at three signal levels dependent upon the signal levels of the first signal and the second signal and wherein the receivers are dual-input differential receivers having a first input coupled to the signal line and a second input coupled to a scaled output of the driver of the corresponding I/O cell.

5. A configurable input/output cell, comprising:
   a first receiver and a second receiver, each receiver having a first input coupled to a respective cell signal line, a second input, and an output coupled to a respective cell output;
   a first driver having an input and an output, the first driver output coupled to the first input of the second receiver;
   a second driver having an input and an output, the second driver output coupled to the first input of the first receiver;
   a first multiplexer having a first input coupled to the output of the first receiver, a second input coupled to a first cell input, and an output coupled to both the first input of the second receiver and the input of the first driver, for selectively routing one of the inputs of the first multiplexer to the output of the first multiplexer in response to a first selection signal; and
   a second multiplexer having a first input coupled to the output of the second receiver, a second input coupled to a second cell input, and an output coupled to the first input of the first receiver, for selectively routing one of the inputs of the second multiplexer to the output of the second multiplexer in response to a second selection signal;

wherein the cell is dynamically configured for any of a plurality of signaling modes including a simultaneous bi-directional signaling mode, a particular one of the plurality of modes responsive to a particular configuration of the selection signals.

6. A signaling system, comprising:

a plurality of dynamically configurable input/output cells coupled in a ring, each cell coupled to a preceding cell by a first port of a signal line and coupled to next cell by a second port of the signal line, each cell including;

a first receiver and a second receiver, each receiver having a first input coupled to one cell signal line, a second input, and an output coupled to a respective cell output;

a first driver having an input and an output, the first driver output coupled to the first input of the second receiver;

a second driver having an input and an output, the second driver output coupled to the first input of the first receiver;

a first multiplexer having a first input coupled to the output of the first receiver, a second input coupled to a first cell input, and an output coupled to both the first input of the second receiver and the input of the first driver, for selectively routing one of the inputs of the first multiplexer to the output of the first multiplexer in response to a first selection signal; and a second multiplexer having a first input coupled to the output of the second receiver, a second input coupled to a second cell input, and an output coupled to the first input of the first receiver, for selectively routing one of the inputs of the second multiplexer to the output of the second multiplexer in response to a second selection signal wherein the cell is dynamically configured for any of a plurality of signaling modes including a simultaneous bi-directional signaling mode, a particular one of the plurality of modes responsive to a particular configuration of the selection signals; and a plurality of agents, one for each cell, for asserting a particular configuration of the selection signals to the respective cell.

7. A method for configuring an input/output (I/O) cell, comprising the steps of:

asserting a first selection signal to a first multiplexer in the cell, the first multiplexer having a first input coupled to an output of a first receiver, a second input coupled to a first cell input, and an output coupled to both a first input of a second receiver and an input of a first driver, for selectively routing one of the inputs of the first multiplexer to the output of the first multiplexer in response to the first selection signal, wherein the output of the first receiver is coupled to a first cell output and second input of the first receiver is coupled to a first port of a signal line; and asserting a second selection signal to a second multiplexer in the cell, the second multiplexer having a first input coupled to a output of a second receiver, a second input coupled to a second cell input, and an output coupled to both a first input of a first receiver and an input of a second driver, for selectively routing one of the inputs of the second multiplexer to the output of the second multiplexer in response to the second signal, wherein the output of the second receiver is coupled to a second cell output and a second input of the second receiver is coupled to a second port of the signal line;

wherein a output of the first driver is coupled to the second input of the second receiver an an output of the second driver is coupled to the second input of the first receiver.

* * * * *

UNITED STATES PATENT AND TRADEMARK OFFICE
CERTIFICATE OF CORRECTION

| | | |
|---|---|---|
| PATENT NO. | : 6,900,664 B2 | Page 1 of 1 |
| APPLICATION NO. | : 10/319141 | |
| DATED | : May 31, 2005 | |
| INVENTOR(S) | : Leon Wu | |

It is certified that error appears in the above-identified patent and that said Letters Patent is hereby corrected as shown below:

In column 1, line 19, delete "reporting", replace with -- repowering --.
In column 1, line 21, delete "reporting", replace with -- repowering --.
In column 1, line 41, delete "1115A", replace with -- 115A --.
In column 10, claim 7, line 16, insert -- a -- after "and".
In column 10, claim 7, line 21, delete "a", replace with -- an --. (First occurrence)

On the title page item [57], Delete "A preferred embodiment includes a distributed network of a plurality of dynamically configurable bi-directional input/output (I/O) cells, each including a forward datapath having a first receiver, for receiving a first input signal from downstream driver on a first port of a signal line, coupled to a first driver for sending a first output signal to a first upstream receiver on a second port of the signal line; and a reverse datapath having a second receiver, for receiving a second input signal from a second downstream driver on the second port of the signal line, coupled to a second driver for sending a second output signal to a second upstream receiver on the first port of the signal line; wherein the first input signal and the second output signal are transmitted concurrently on the first port of the signal line. "

Replace with -- A preferred embodiment includes a distributed network of a plurality of dynamically configurable bi-directional input/output (I/O) cells, each cell including a forward datapath having a first receiver, for receiving a first input signal from a first downstream driver on a first port of a signal line, coupled to a first driver for sending a first output signal to a first upstream receiver on a second port of the signal line; and a reverse datapath having a second receiver, for receiving a second input signal from a second downstream driver on the second port of the signal line, coupled to a second driver for sending a second output signal to a second upstream receiver on the first port of the signal line; wherein the first input signal and the second output signal are transmitted concurrently on the first port of the signal line. --

Signed and Sealed this

Twenty-second Day of August, 2006

JON W. DUDAS
*Director of the United States Patent and Trademark Office*